(12) United States Patent
Liu et al.

(10) Patent No.: US 11,489,052 B2
(45) Date of Patent: Nov. 1, 2022

(54) THIN FILM TRANSISTOR, MANUFACTURING METHOD OF THIN FILM TRANSISTOR AND DISPLAY DEVICE

(71) Applicants: MIANYANG BOE OPTOELECTRONICS TECHNOLOGY CO.,LTD., Sichuan (CN); BOE Technology Group Co., Ltd., Beijing (CN)

(72) Inventors: Wenhui Liu, Beijing (CN); Linchang Zhong, Beijing (CN)

(73) Assignees: Mianyang Boe Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 139 days.

(21) Appl. No.: 16/767,923

(22) PCT Filed: Dec. 17, 2019

(86) PCT No.: PCT/CN2019/126105
§ 371 (c)(1),
(2) Date: May 28, 2020

(87) PCT Pub. No.: WO2020/140750
PCT Pub. Date: Jul. 9, 2020

(65) Prior Publication Data
US 2021/0234011 A1    Jul. 29, 2021

(30) Foreign Application Priority Data

Jan. 2, 2019    (CN) .......................... 201910002600.4

(51) Int. Cl.
*H01L 29/417* (2006.01)
*H01L 29/40* (2006.01)
(Continued)

(52) U.S. Cl.
CPC ...... *H01L 29/41733* (2013.01); *H01L 29/401* (2013.01); *H01L 29/513* (2013.01); *H01L 29/78666* (2013.01); *H01L 29/78675* (2013.01)

(58) Field of Classification Search
CPC ........... H01L 27/1248; H01L 29/78618; H01L 29/41733; H01L 29/78675; H01L 29/513;
(Continued)

(56) References Cited

U.S. PATENT DOCUMENTS

| 2006/0145162 A1* | 7/2006 | Yang | .................. G02F 1/13454 257/72 |
| 2008/0083927 A1* | 4/2008 | Nishiura | ............... H01L 27/124 257/72 |

(Continued)

FOREIGN PATENT DOCUMENTS

| CN | 102790096 A | 11/2012 |
| CN | 103258745 A | 8/2013 |

(Continued)

OTHER PUBLICATIONS

Chinese Office Action dated Sep. 2, 2020 in related Chinese Application No. 201910002600.4.

*Primary Examiner* — Mouloucoulaye Inoussa
(74) *Attorney, Agent, or Firm* — ArentFox Schiff LLP; Michael Fainberg

(57) ABSTRACT

The present disclosure provides a thin film transistor, a manufacturing method of the thin film transistor and a display device, configured to improve electrical property of the thin film transistor. The thin film transistor includes: an active layer, including a source and drain contact region and a channel region; a metal barrier layer, covering the source and drain contact region; a first gate insulating layer, at least covering the channel region and exposing the metal barrier layer; a gate, on the first gate insulating layer and covering (Continued)

the channel region; an inner layer dielectric layer, on the gate and having a through hole exposing the metal barrier layer; and a source and drain, on the inner layer dielectric layer and in contact with the metal barrier layer through the through hole.

11 Claims, 6 Drawing Sheets

(51) Int. Cl.
*H01L 29/51* (2006.01)
*H01L 29/786* (2006.01)

(58) Field of Classification Search
CPC ............. H01L 29/78666; H01L 29/401; H01L 27/1288; H01L 29/66969; H01L 27/1262; H01L 29/7869; H01L 27/1225; H01L 21/0273; H01L 27/124; H01L 21/02595; H01L 23/3171; H01L 21/32139; H01L 29/4958; H01L 27/12; H01L 21/02532; H01L 29/4908; H01L 27/1222; H01L 29/786; H01L 21/26513; H01L 29/66757; H01L 29/78633; H01L 29/42384; H01L 21/3065; H01L 21/283; H01L 29/458; H01L 27/3262; H01L 2227/323; H01L 27/3276

USPC .......... 257/71, 72, 347, 59, 40, 66, E29.278, 257/E27.111, E27.113, E33.053, E29.273, 257/E27.112, E21.409; 438/23, 24, 25, 438/34, 151, 166
See application file for complete search history.

(56) References Cited

U.S. PATENT DOCUMENTS

| | | | |
|---|---|---|---|
| 2011/0303923 A1* | 12/2011 | Noh | ................... H01L 29/78618 257/72 |
| 2012/0286259 A1 | 11/2012 | Park et al. | |
| 2015/0171224 A1 | 6/2015 | Liu et al. | |
| 2015/0295094 A1 | 10/2015 | Ren et al. | |
| 2016/0247823 A1* | 8/2016 | Zuo | ................... H01L 29/78675 |

FOREIGN PATENT DOCUMENTS

| | | |
|---|---|---|
| CN | 105932067 A | 9/2016 |
| CN | 107808826 A | 3/2018 |
| CN | 108538725 A | 9/2018 |
| CN | 109686795 A | 4/2019 |
| KR | 20150048361 A | 5/2015 |

* cited by examiner

THIN FILM TRANSISTOR, MANUFACTURING METHOD OF THIN FILM TRANSISTOR AND DISPLAY DEVICE

CROSS REFERENCE TO RELATED APPLICATIONS

The present disclosure is a National Stage of International Application No. PCT/CN2019/126105, filed Dec. 17, 2019, claims the priority of Chinese patent application No. 201910002600.4, filed with Chinese Patent Office on Jan. 2, 2019, both of which are incorporated by reference herein in its entirety.

FIELD

The present disclosure relates to the field of display technologies, in particular to a thin film transistor, a manufacturing method of a thin film transistor and a display device.

BACKGROUND

A thin film transistor (TFT) is configured to drive a light emitting element in a display device to emit light. The TFT includes a top-gate thin film transistor and a bottom-gate thin film transistor. The top-gate thin film transistor includes a substrate, a buffer layer, an active layer, a gate, a gate insulating layer, an inner layer dielectric layer (ILD) in sequence from bottom to top, and further includes a source and a drain on the inner layer dielectric layer and in a channel region of the active layer. In a process of forming a source and drain of a top-gate thin film transistor, an inner layer dielectric layer is etched through a dry etching process to form a deep hole, such that the source and drain are in contact with the active layer to form a TFT switch. However, the end point is not easy to control and the active layer in a channel region is easily corroded in the condition that a dry etching process is adopted.

SUMMARY

In a first aspect, the present disclosure provides a thin film transistor, including:
- an active layer, including a source and drain contact region and a channel region;
- a metal barrier layer, covering the source and drain contact region;
- a first gate insulating layer, at least covering the channel region and exposing the metal barrier layer;
- a gate, on the first gate insulating layer and covering the channel region;
- an inner layer dielectric layer, on the gate and having a through hole exposing the metal barrier layer; and
- a source and drain, on the inner layer dielectric layer and in contact with the metal barrier layer through the through hole.

In the possible design, the region at which the through hole is in contact with the metal barrier layer is smaller than a pattern of the metal barrier layer.

In the possible design, the first gate insulating layer is provided with a via hole exposing the metal barrier layer; or the first gate insulating layer only covers the channel region.

In the possible design, the metal barrier layer is a single-layer film, the material of the metal barrier layer is molybdenum, titanium, aluminum, molybdenum-titanium alloy, titanium-aluminum alloy or molybdenum-titanium-aluminum alloy, the source and drain is a double-layer film, and the source and drain is an aluminum-titanium film, aluminum-molybdenum film or titanium-molybdenum film.

In the possible design, the thickness of the metal barrier layer is 100 Å-1000 Å.

In the possible design, the inner layer dielectric layer includes: a second gate insulating layer and a passivation layer arranged in sequence in a laminated manner.

On a second aspect, a manufacturing method of a thin film transistor is provided, including:
- forming in sequence an active layer, a first gate insulating layer and a gate;
- patterning the first gate insulating layer to expose a source and drain contact region by utilizing the shielding of the gate, and implanting ions into the active layer to form the source and drain contact region;
- forming a metal barrier layer on the source and drain contact region;
- forming an inner layer dielectric layer which has a through hole exposing the metal barrier layer; and
- forming, on the inner layer dielectric layer, a source and drain in contact with the metal barrier layer through the through hole.

In the possible design, the forming a metal barrier layer on the source and drain contact region includes:
- depositing a metal film in the source and drain contact region of the active layer;
- forming photoresist on the metal film, exposing and developing the photoresist to form photoresist with a first pattern, wherein the photoresist with the first pattern includes a photoresist reserved region and a photoresist unreserved region; and
- etching the metal film with the photoresist with the first pattern as a mask, to remove the metal film of the photoresist unreserved region, and to form the metal barrier layer.

In the possible design, the forming an inner layer dielectric layer which has a through hole exposing the metal barrier layer includes:
- depositing a second gate insulating film and a passivation film in sequence on the gate; and
- primary patterning the second gate insulating film and the passivation film, to form an inner layer dielectric layer which has a through hole exposing the metal barrier layer.

On a third aspect, a display device is provided. The display device includes the thin film transistor in the first aspect and in any possible design.

DETAILED DESCRIPTION OF THE EMBODIMENTS

In the related art, an etched barrier layer is adopted to cover part of the active layer. To avoid corrosion to the etched barrier layer caused by the etching process, an etched barrier layer of inorganic materials will be generally adopted in the related art. However, the existence of such type of etched barrier layer will lead to reduced contact area between the source and the active layer, and between the drain and the active layer, thereby leading to increased contact resistance between the source and drain and the active layer, and further influencing the electrical property of the thin film transistor.

In order to make the objectives, technical solutions, and advantages of the embodiments of the present disclosure clearer, a clear and complete description will be given below on the technical solutions of the embodiments of the present disclosure in combination with accompanying drawings of the embodiments of the present disclosure.

The background art of the embodiments of the present disclosure will be introduced below.

Figure 1:
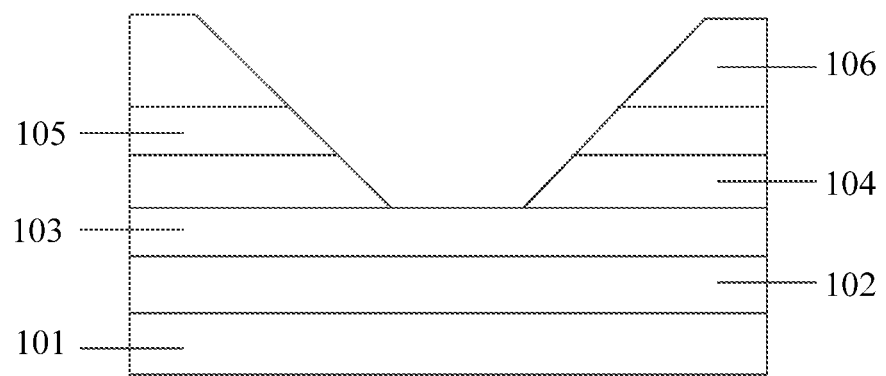
FIG. 1 is schematic diagram of part of the structures of a thin film transistor after an inner layer dielectric layer is etched in the related art.

In the related art, please refer to FIG. 1, the thin film transistor includes a substrate 101, a buffer layer 102, an active layer 103, a first gate insulating layer 104, a second gate insulating layer 105, an inner layer dielectric layer 106, a gate, a source and a drain, wherein the gate, the source and the drain are not shown in FIG. 1.

In order that the source and the drain can be in contact with the active layer 103, in the process of manufacturing a thin film transistor, the inner layer dielectric layer 106 needs to be etched with a hole to form the structure as shown in FIG. 1. However, since the active layer 103 itself is thin, therefore, to prevent the active layer from being etched, in the process of etching the inner layer dielectric layer 106, an etching barrier layer will be added.

In order to avoid corrosion to the etched barrier layer caused by the etching process, an etched barrier layer will generally adopt an inorganic material. Since the inorganic material is generally poor in conductivity, only the side face of the source and the drain can be mounted on the active layer not covered by the etched barrier layer, thereby relatively reducing the contact area between the active layer and the source, and between the active layer and the drain, and further influencing the electrical property of the thin film transistor.

Figure 2:
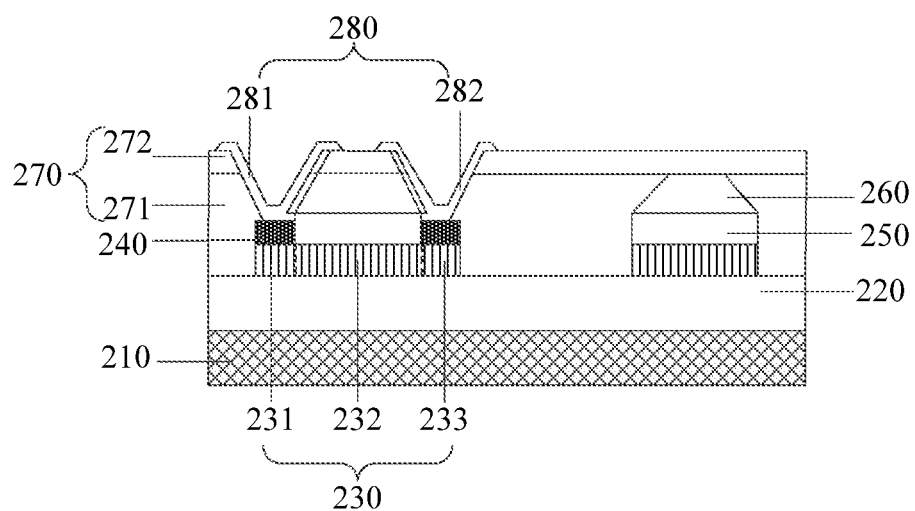
FIG. 2 is a structural schematic diagram of the thin film transistor provided in an embodiment of the present disclosure.

An embodiment of the present disclosure provides a thin film transistor, it should be understood that, the preferred embodiments described below are merely for illustrating and explaining the present disclosure, rather than for defining the present disclosure. Moreover, in the absence of conflicts, the embodiments in the present disclosure and the features in the embodiments can be combined with each other. Please refer to FIG. 2 and FIG. 2 is a structural diagram of the thin film transistor. The thin film transistor includes an active layer 230, a metal barrier layer 240, a first gate insulating layer 250, a gate 260, an inner layer dielectric layer 270, and a source and drain 280.

Specifically, the active layer 230 includes a source contact region 231, a channel region 232 and a drain contact region 233. The drain contact region 233 and the source contract region 231 are just the source and drain contact region mentioned herein. The metal barrier layer 240 is on the source contact region 231 and the drain contact region 233 of the active layer 230. The first gate insulating layer 250 at least covers the channel region 232 of the active layer 230, and exposes the metal barrier layer 240. The gate 260 is on the first gate insulating layer 250 and covers the channel region 232. The inner layer dielectric layer 270 is on the gate 260, and has a through hole exposing the metal barrier layer 240. The source and drain 280 is on the through hole in the inner layer dielectric layer 270, and is in contact with the metal barrier layer 240. The source and drain 280 includes a source 281 and a drain 282. It should be noted that, an insulating layer should also be between the source and drain 280 and the gate 260 in FIG. 2, and the insulating layer is not labeled in the figure.

In the embodiment of the present disclosure, the metal barrier layer 240 is on the source contact region 231 and the drain contact region 233 of the active layer 230, and the metal barrier layer 240 can protect the source contract region 231 and the drain contact region 233 from being etched when the through hole in the inner layer dielectric layer 270 is etched. Moreover, the metal barrier layer 240 can serve as a medium for electrical connection between the source 281 and the active layer 230, and between the drain 282 and the active layer 230, so as to relatively increase the contact area between the source 281 and the active layer 230, and between the drain 282 and the active layer 230, and ensure the electrical property of the thin film transistor.

It should be noted that, please continue to refer to FIG. 2, in addition to the parts described above, the thin film transistor further includes a substrate 210 and a buffer layer 220. The buffer layer 220 is on the substrate 210 and the active layer 230 is arranged on the buffer layer 220.

Wherein the material of the substrate 210 can be for example glass. The material of the buffer layer 220, the first gate insulating layer 250 and the inner layer dielectric layer 270 can be for example silicon oxide (SiOx) or silicon nitride (SiNx). The material of the gate 260, the source 281 and the drain 282 can be for example one or a stack combination of more of molybdenum, titanium, aluminum, silver and copper. The stack combination can be understood as a process in which multiple metals are respectively deposited to form in sequence different metal film layers. The material of the active layer 230 can be for example a-Si or p-Si.

In the possible design, the region at which the metal barrier layer 240 is in contact with the through hole in the inner layer dielectric layer 270 is smaller than a pattern of the metal barrier layer 240.

Specifically, the pattern of the metal barrier layer 240 can be understood as an upper surface of the metal barrier layer

240. The region at which the metal barrier layer 240 is in contact with the through hole in the inner layer dielectric layer 270 is smaller than a pattern of the metal barrier layer 240. Since the width of the region at which the metal barrier layer 240 is in contact with the through hole in the inner layer dielectric layer 270 is generally the same as the width of the pattern of the metal barrier layer 240, i.e., the length of the metal barrier layer 240 is greater than the smallest diameter of the through hole in the inner layer dielectric layer 270. The through hole in the inner layer dielectric layer 270 is generally gradually decreased from top to bottom, and the diameter of the lowest part of the through hole in the inner layer dielectric layer 270 can be understood as the smallest diameter of the through hole in the inner layer dielectric layer 270. Generally speaking, the length of the metal barrier layer 240 is greater than the smallest diameter of the through hole in the inner layer dielectric layer 270 by 1 μm-4 μm. Of course, the region at which the metal barrier layer 240 is in contact with the through hole in the inner layer dielectric layer 270 can also be equal to the pattern of the metal barrier layer 240.

In the embodiment of the present disclosure, the length of the metal barrier layer 240 is set to be larger than the smallest diameter of the through hole in the inner layer dielectric layer 270, therefore, on the one hand, when the inner layer dielectric layer 270 is etched, the metal barrier layer 240 can be ensured to completely cover the through hole, and the active layer 230 will not be etched; on the other hand, the metal barrier layer 240 is set to be relatively large, thereby relatively increasing the contact area between the metal barrier layer 240 and the active layer 230.

In the possible design, the material of the metal barrier layer 240 is molybdenum, titanium, aluminum, molybdenum-titanium alloy, titanium-aluminum alloy or molybdenum-titanium-aluminum alloy. The source 281 and the drain 282 are both double-layer films, and the double-layer films are aluminum-titanium films, aluminum-molybdenum films or titanium-molybdenum films.

Specifically, the metal barrier layer 240 can be a single-layer film, and can also be multi-layer film, which is not specifically defined herein. On the one hand, the metal barrier layer 240 needs to be not corroded by etching gas for etching the inner layer dielectric layer 270, and on the other hand, the metal barrier layer 240 also needs to have certain conductivity, to realize conduction between the source and drain 280 and the active layer 230. Since the metal barrier layer 240 is conductive, the metal barrier layer 240 can be equivalent to a layer of film of the source and drain 280, such that the source and drain 280 can use a double-layer film structure. Generally speaking, to ensure favorable conductivity and stability of the source and drain 280, the layer of film structure, relatively proximate to the metal barrier layer 240, of the source and drain 280 generally is an aluminum film, and the layer of film structure, relatively away from the metal barrier layer 240, of the source and drain 280 generally is a titanium film.

It should be noted that, when a metal barrier layer 240 is added, the source 281 and the drain 282 can still be a three-layer film structure in the related art.

In the embodiment of the present disclosure, the metal barrier layer 240 made of corresponding metal can ensure that the metal barrier layer 240 will not be corroded by the etching gas for etching the inner layer dielectric layer 270. Moreover, the conductivity of the metal barrier layer 240 is favorable, such that the source and drain 280 is electrically connected with the active layer 230 through the metal barrier layer 240. Moreover, the metal barrier layer 240 is made of the above metal, such that the metal barrier layer 240 can be equivalent to a single-layer film structure of the source and drain 280, and the source and drain 280 only needs to adopt a double-layer film. Compared with the manner in the related art that the source and drain 280 adopts a three-layer structure, the thin film transistor in the embodiment of the present disclosure can save materials of the thin film transistor while ensuring electrical property, thereby relatively lowering cost of the thin film transistor.

In the possible design, the thickness of the metal barrier layer 240 is 100 Å-1000 Å.

Specifically, Å is angstrom and is the unit of length. 1 Å is equal to $10^{-10}$ m. An overlarge thickness of the metal barrier layer 240 will lead to higher cost of the thin film transistor, and is not beneficial for miniaturization of the thin film transistor. However, if the thickness of the metal barrier layer 240 is too small, the withstand voltage of the thin film transistor may be possibly small. Therefore, in the embodiment of the present disclosure, the thickness of the metal barrier layer 240 is set reasonably, to ensure the quality of the thin film transistor.

In the possible design, the first gate insulating layer 250 is provided with a via hole exposing the metal barrier layer 240; or, the first gate insulating layer 250 only covers the channel region 232.

Figure 3:
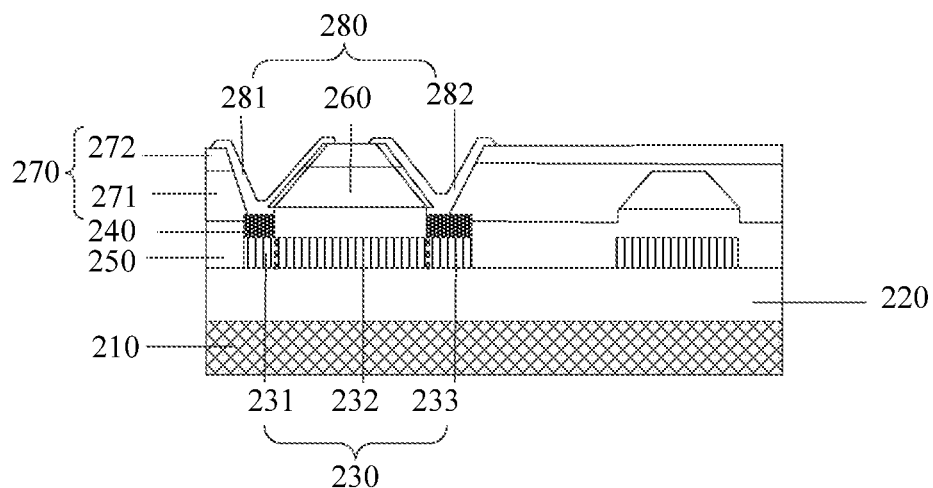
FIG. 3 is another structural schematic diagram of the thin film transistor provided in the embodiment of the present disclosure.

Specifically, please continue to refer to FIG. 2, the first gate insulating layer 250 is set in two manners. In the first setting manner, the first gate insulating layer 250 can be only on the channel region 232. In another setting manner, as shown in FIG. 3, the first gate insulating layer 250 includes a via hole, and the via hole can ensure that the metal barrier layer 240 is exposed. For example, part of the buffer layer 220 is covered by the active layer 230, and the other parts of the buffer layer 220 can be covered by the first gate insulating layer 250.

In the embodiment of the present disclosure, two manners for setting the first gate insulating layer 250 are provided, thereby improving the flexibility of the first gate insulating layer 250, and satisfying requirements of different users on the thin film transistor.

In the possible design, please continue to refer to FIG. 2 or FIG. 3, the inner layer dielectric layer 270 includes a second gate insulating layer 271 and a passivation layer 272 which are arranged in sequence in a laminated manner.

Specifically, the material of the second gate insulating layer 271 and the passivation layer 272 can be for example silicon oxide or silicon nitride. In the embodiment of the present embodiment, the inner layer dielectric layer 270 includes the second gate insulating layer 271 and the passivation layer 272 which are arranged in sequence in a laminated manner, thereby better ensuring that the gate 260 can be covered, and increasing the service life of the gate 260.

Wherein, in order to ensure stability of the chemical property of the thin film transistor, the first gate insulating layer 250 and the second gate insulating layer 271 adopt two different materials. For example, the first gate insulating layer 250 adopts silicon oxide, and the corresponding second gate insulating layer 271 adopts silicon nitride. It should be noted that, an insulating layer should also be between the source and drain 280 and the gate 260 in FIG. 3, and the insulating layer is not labeled in the figure.

Figure 4:
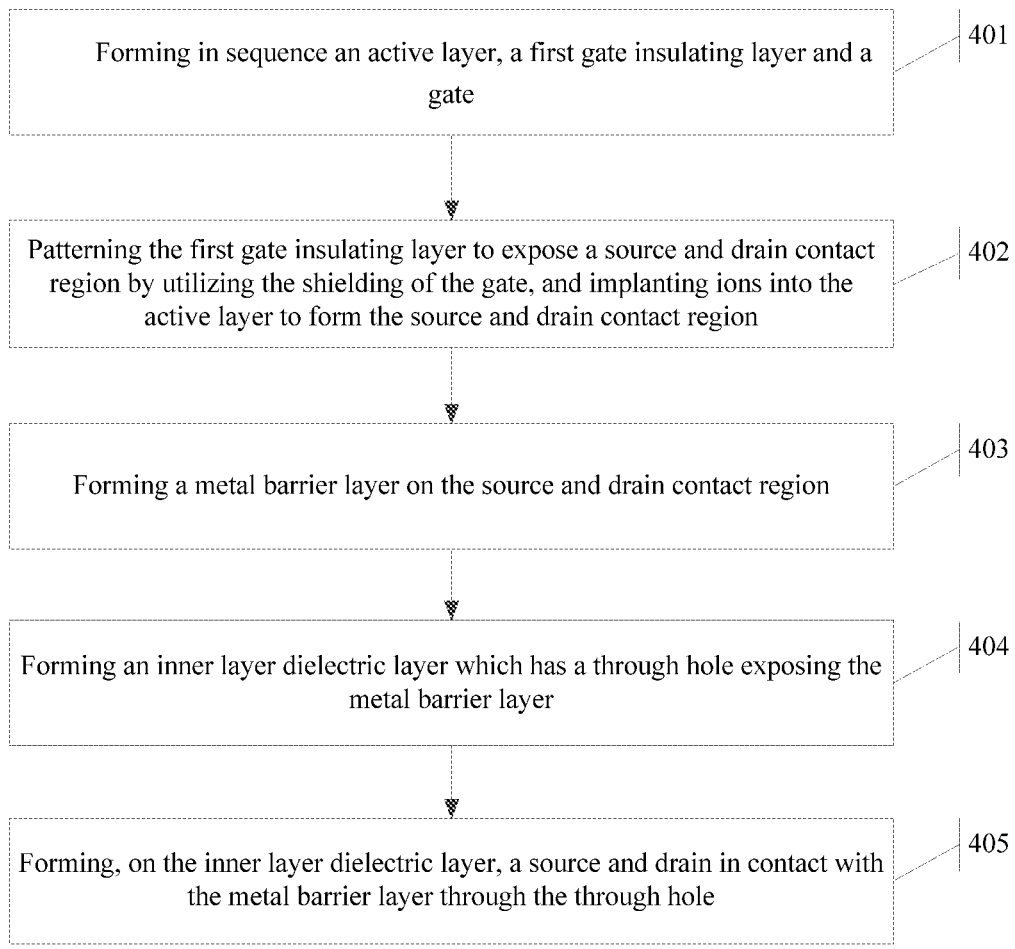
FIG. 4 is a flow chart of a manufacturing method of the thin film transistor provided in the embodiment of the present disclosure.

Based on the same inventive concept, the embodiment of the present disclosure further provides a manufacturing method of a thin film transistor. The repeated part of the method with the thin film transistor discussed above will not be repeated redundantly herein. Please refer to FIG. 4, and the manufacturing method specifically includes the following step.

Step 401, forming in sequence an active layer 230, a first gate insulating layer 250 and a gate 260.

Step 402, patterning the first gate insulating layer 250 to expose a source and drain contact region by utilizing the shielding of the gate 260, and implanting ions into the active layer 230 to form the source and drain contact region.

Step 403, forming a metal barrier layer 240 on the source and drain contact region.

Step 404, forming an inner layer dielectric layer 270 which has a through hole exposing the metal barrier layer 240.

Step 405, forming, on the inner layer dielectric layer 270, a source and drain 280 in contact with the metal barrier layer 240 through the through hole.

Figure 5:
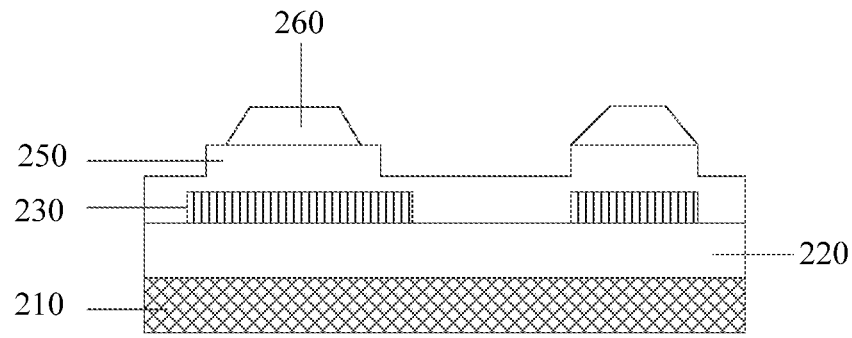
FIG. 5 is a schematic diagram of another manufacturing process of the thin film transistor provided in the embodiment of the present disclosure.

The step 401 is illustrated below in combination with FIG. 5.

Specifically, a buffer layer 220 is formed on the substrate 210, and an active layer 230, a first gate insulating layer 250 and a gate 260 are formed on the buffer layer 220 in sequence. For the contents of structures and materials of the substrate 210, the buffer layer 220, the active layer 230, the first gate insulating layer 250 and the gate 260, please refer to the contents discussed above, which will not be repeated redundantly herein. A buffer layer 220 and an active film are deposited on the substrate 210 in sequence, and then the active layer 230 is obtained by patterning the active film. A first gate insulating film and a gate film are then deposited on the active layer 230 and the buffer layer 220. And then the gate film is patterned to obtain a gate 260, i.e., to obtain the structure shown in FIG. 4. The deposition manner can be a physical vapor deposition process or a chemical vapor deposition process, and the deposition manner is not specifically defined herein.

The step 402 is illustrated with examples below in combination with FIG. 6 and FIG. 7.

Figure 6:
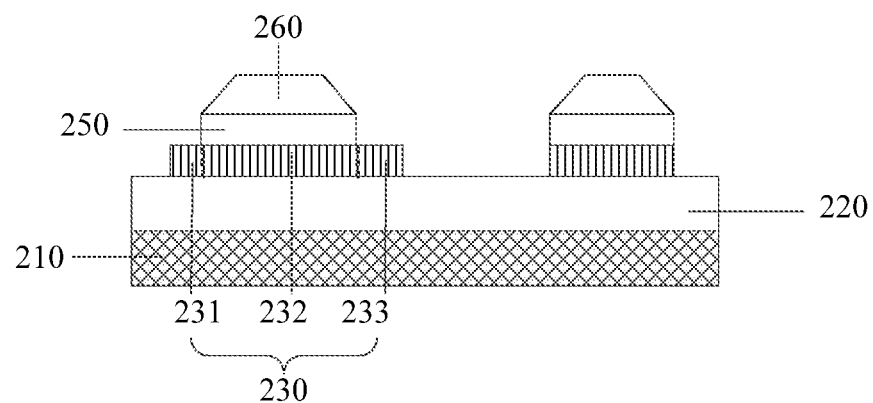
FIG. 6 is a schematic diagram of another manufacturing process of the thin film transistor provided in the embodiment of the present disclosure.
Figure 7:
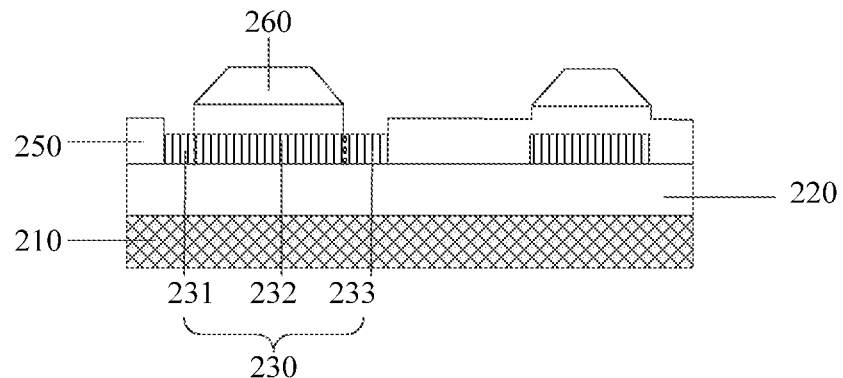
FIG. 7 is a schematic diagram of another manufacturing process of the thin film transistor provided in the embodiment of the present disclosure.

Specifically, please refer to FIG. 6, the gate 260 shields part of the first gate insulating film, and other part of the first gate insulating film is exposed outside. The first gate insulating film is firstly patterned to expose the source contact region 231 and the drain contact region 233, and then ions are implanted into the source contact region 231 and the drain contact region 233. Since the channel region 232 of the active layer 230 is shielded by the first gate insulating layer 250, therefore, the ions ican only be implanted into the source contact region 231 and the drain contact region 233 of the active layer 230. The ion implanted is for example boron. The ion implanted can improve the conductivity of the source contact region 231 and the drain contact region 233, such that the source contact region 231 and the drain contact region 233 have the electrical property of semiconductors.

Wherein patterning the first gate insulating film to expose the source contact region 231 and the drain contact region 233 can be patterning the part of the first gate insulating film except the part, corresponding to the channel region 232, of the first gate insulating film, to form the first gate insulating layer 250 only covering the gate 260, and to form the structure shown in FIG. 6. The patterning the first gate insulating film to expose the source and drain contact region can also be patterning the part, corresponding to the source contact region 231 and the drain contact region 233, of the first gate insulating film, to form a first gate insulating layer 250 having a via hole exposing the metal barrier layer 240, and to form the structure shown in FIG. 7.

It should be noted that, the etching depth for the first gate insulating layer 250 is generally 500 Å-2000 Å, and the semiconductor layer 230 is not etched.

The step 403 is illustrated with examples below in combination with FIG. 8 and FIG. 9. For example, the step 403 includes the following steps:

depositing a metal film in the source and drain contact region of the active layer 230;

forming photoresist on the metal film, exposing and developing the photoresist to form photoresist with a first pattern, wherein the photoresist with the first pattern includes a photoresist reserved region and a photoresist unreserved region; and etching the metal film with the photoresist with the first pattern as a mask, to remove the metal film of the photoresist unreserved region, and to form the metal barrier layer 240.

Specifically, a metal film is deposited on the source and drain contact region of the active layer 230, and deposition can be for example a physical vapor deposition process. A photoresist is coated on the metal film, the photoresist is exposed and developed, and the metal film is etched, to form a metal barrier layer 240. For the contents of the thickness and length of the metal barrier layer 240, please refer to the contents discussed above, and the thickness and length of the metal barrier layer will not be repeated redundantly herein. If the metal barrier layer 240 adopts two layers of metal film, then a first layer of metal film is deposited firstly at the source and drain contact region, then a second layer of metal film is deposited at the source and drain contact region. The two layers of metal films are coated with photoresist, the photoresist is exposed and developed, and the two layers of metal films are etched, to form a metal barrier layer 240. A metal barrier layer 240 is formed on the structure shown in FIG. 6, to form the structure shown in FIG. 8. A metal barrier layer 240 is formed on the structure shown in FIG. 7, to form the structure shown in FIG. 9.

In the embodiment of the present disclosure, the adoption of pattering to form a metal barrier layer 240 is taken as an example, however, the manners of forming a metal barrier layer 240 is actually not limited to this. When the method is adopted to form a metal barrier layer 240, the process is mature and the manufacturing method is simple.

The step 404 is illustrated with examples below with reference to FIG. 10 and FIG. 11. The step 404 specifically includes:

depositing a second gate insulating film and a passivation film in sequence on the gate 260; and primary patterning the second gate insulating film and the passivation film, to form an inner layer dielectric layer 270 which has a through hole exposing the metal barrier layer.

Figure 8:
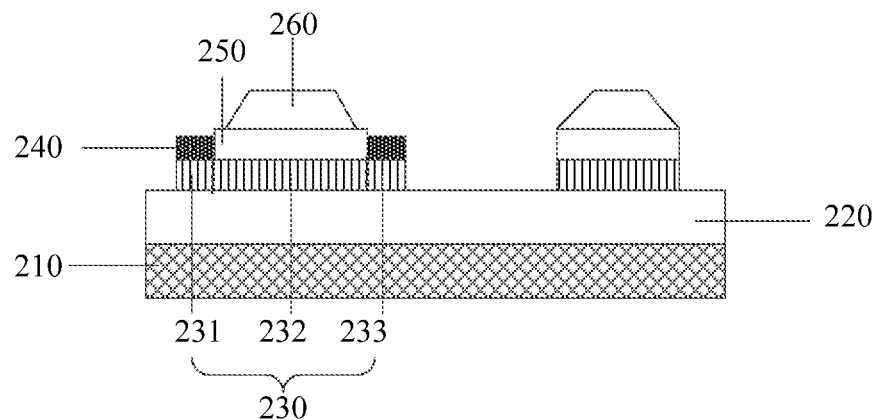
FIG. 8 is a schematic diagram of another manufacturing process of the thin film transistor provided in the embodiment of the present disclosure.
Figure 9:
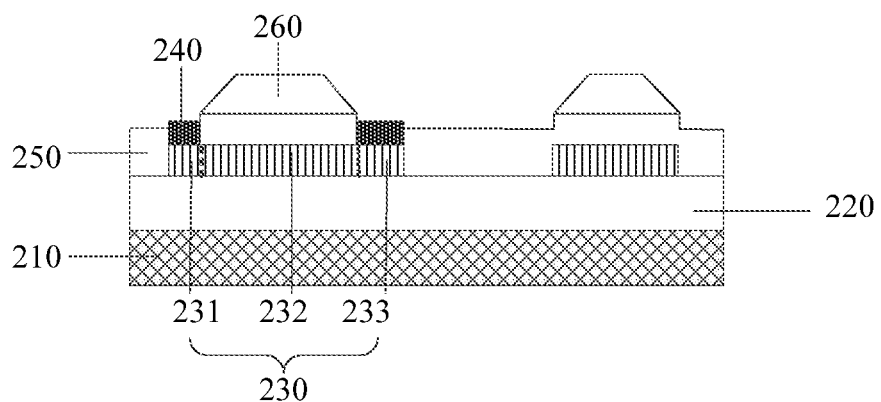
FIG. 9 is a schematic diagram of another manufacturing process of the thin film transistor provided in the embodiment of the present disclosure.

Specifically, a second gate insulating film and a passivation layer film are sequentially deposited on the buffer layer 220 and the gate 260 shown in FIG. 8. If the first gate insulating layer 250 on the buffer layer 220 is not etched, then the second gate insulating film and the passivation layer film are directly deposited on the first gate insulating layer 250 and the gate 260 shown in FIG. 9 in sequence. Deposition for example is a chemical vapor deposition process. The second gate insulating film and the passivation film are patterned primarily to form an inner layer dielectric layer 270 with a through hole. Primary patterning includes: coating photoresist, exposing and developing the photoresist to form a photoresist with a pattern, and dry etching the second gate insulating film and the passivation layer film with the photoresist with a pattern as a mask, to form an inner layer dielectric layer 270 with a through hole. The etching gas of dry etching can be for example carbon tetrafluoride/oxygen, or carbon tetrafluoride/argon/trifluoromethane, etc. After the step 404 is performed on the structure of FIG. 8, the structure shown in FIG. 10 is formed. And after the step 404 is performed on the structure of FIG. 9, the structure shown in FIG. 11 is formed.

In the embodiment of the present disclosure, the gas for etching will not corrode the metal barrier layer 240, thereby ensuring that the active layer 230 beneath the metal barrier layer 240 will not be etched, and further ensuring quality of the thin film transistor.

The step 405 is illustrated with examples below with reference to FIG. 2 and FIG. 3.

Figure 10:
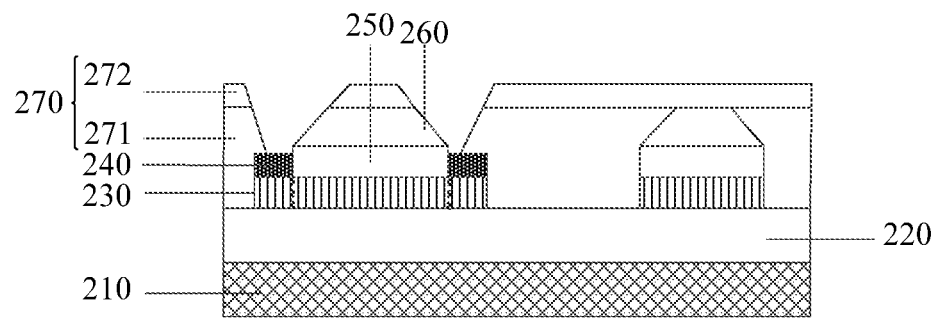
FIG. 10 is a schematic diagram of another manufacturing process of the thin film transistor provided in the embodiment of the present disclosure.
Figure 11:
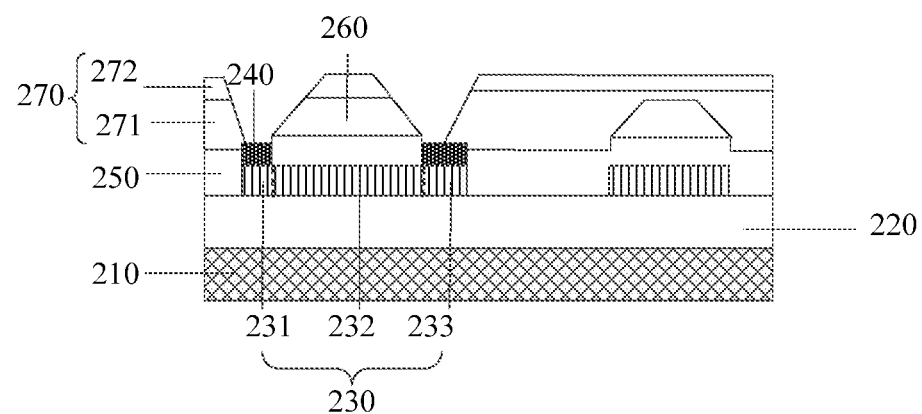
FIG. 11 is a schematic diagram of another manufacturing process of the thin film transistor provided in the embodiment of the present disclosure.

Specifically, a source film and a drain film are deposited on the inner layer dielectric layer 270 shown in FIG. 10, and then patterning the source film and the drain film, to obtain a source 281 and a drain 282 which are in contact with the metal barrier layer 240 through a through hole. patterning includes: coating photoresist, exposing and developing the photoresist to form a photoresist with a pattern, and dry etching the source film and the drain film with the photoresist with the pattern as a mask, to form a source 281 and a drain 282, i.e., the thin film transistor shown in FIG. 2. The gas used in dry etching can be chlorine, etc. Due to the metal barrier layer 240, the source 281 and the drain 282 can both be two layers of metal films, without being three layers of metal films in the related art, thereby relatively reducing cost of the thin film transistor. Or the same step 405 is performed on the structure shown in FIG. 11, to form the thin film transistor shown in FIG. 3.

Figure 12:
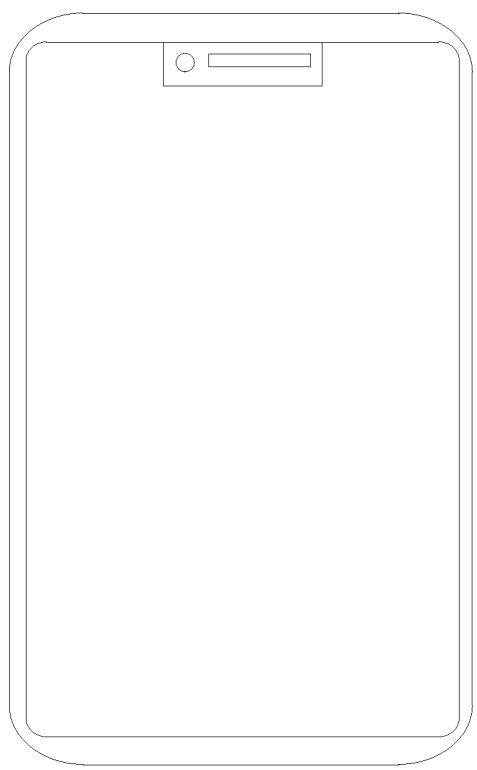
FIG. 12 is a structural diagram of a display device provided in the embodiment of the present disclosure.

Based on the same inventive concept, the embodiment of the present disclosure further provides a display device. Please refer to FIG. 12, the display device includes the above thin film transistor provided in the embodiment of the present disclosure. The display device can be a mobile phone, a tablet personal computer, a television, a display, a notebook computer, a digital photo frame, a navigator or any other products or parts with a display function. The other essential components of the display device should be provided as understood by those skilled in the art, are not repeated redundantly herein, and also should not be deemed as a limitation to the present disclosure. For the implementation of the display device, please refer to the embodiment of the above thin film transistor, and the repeated parts will not be repeated redundantly herein.

It should be noted that, the shape and size of each part in the above accompanying drawings do not reflect true proportions, merely aiming at schematically illustrating the content of the embodiments of the present disclosure.

As mentioned above, the above embodiments are merely used for a detailed introduction of the technical solutions of the present disclosure, however, the description of the above embodiments are merely for helping to understand the method of the embodiments of the present disclosure, and should not be understood as a limitation to the embodiments of the present disclosure. Any variations or substitutions easily conceivable by those skilled in the art shall all fall within the protection scope of the embodiments of the present disclosure.

The invention claimed is:

1. A thin film transistor, comprising:
   an active layer, including a source and drain contact region and a channel region;
   a metal barrier layer, covering the source and drain contact region;
   a first gate insulating layer, at least covering the channel region and exposing the metal barrier layer;
   a gate, on the first gate insulating layer and covering the channel region;
   an inner layer dielectric layer, on the gate and having a through hole exposing the metal barrier layer; and
   a source and drain, on the inner layer dielectric layer and in contact with the metal barrier layer through the through hole;
   wherein the first gate insulating layer only covers the channel region.

2. The thin film transistor of claim 1, wherein the region at which the through hole is in contact with the metal barrier layer is smaller than a pattern of the metal barrier layer.

3. The thin film transistor of claim 1, wherein the thickness of the metal barrier layer is 100 Å-1000 Å.

4. The thin film transistor of any of claim 1, wherein the inner layer dielectric layer comprises: a second gate insulating layer and a passivation layer arranged in sequence in a laminated manner.

5. A manufacturing method of the thin film transistor, comprising:
   forming in sequence an active layer, a first gate insulating layer and a gate;
   patterning the first gate insulating layer to expose a source and drain contact region by utilizing the shielding of the gate, and implanting ions into the active layer to form the source and drain contact region;
   forming a metal barrier layer on the source and drain contact region;
   forming an inner layer dielectric layer which has a through hole exposing the metal barrier layer; and
   forming, on the inner layer dielectric layer, a source and drain in contact with the metal barrier layer through the through hole;
   wherein the forming a metal barrier layer on the source and drain contact region comprises:
      depositing a metal film in the source and drain contact region of the active layer;
      forming photoresist on the metal film, exposing and developing the photoresist to form photoresist with a first pattern, wherein the photoresist with the first pattern includes a photoresist reserved region and a photoresist unreserved region; and
      etching the metal film with the photoresist with the first pattern as a mask, to remove the metal film of the photoresist unreserved region, and to form the metal barrier layer.

6. The method of claim 5, wherein the forming an inner layer dielectric layer which has a through hole exposing the metal barrier layer comprises:
   depositing a second gate insulating film and a passivation film in sequence on the gate; and
   primary patterning the second gate insulating film and the passivation film, to form an inner layer dielectric layer which has a through hole exposing the metal barrier layer.

7. A display device, comprising the thin film transistor of claim 1.

8. The thin film transistor of claim 1, wherein the source and drain is a double-layer film.

9. The thin film transistor of claim 1, wherein the material of the metal barrier layer is molybdenum, titanium, aluminum, molybdenum-titanium alloy, titanium-aluminum alloy or molybdenum-titanium-aluminum alloy.

10. The thin film transistor of claim 1, wherein the metal barrier layer is a single-layer film.

11. The thin film transistor of claim 1, wherein the source and drain is an aluminum-titanium film, aluminum-molybdenum film or titanium-molybdenum film.

\* \* \* \* \*